(12) United States Patent
Johnson et al.

(10) Patent No.: US 11,509,843 B2
(45) Date of Patent: Nov. 22, 2022

(54) LOW POWER SHARED IMAGE PIXEL ARCHITECTURE

(71) Applicant: SEMICONDUCTOR COMPONENTS INDUSTRIES, LLC, Phoenix, AZ (US)

(72) Inventors: Richard Scott Johnson, Boise, ID (US); Debashree Guruaribam, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 173 days.

(21) Appl. No.: 16/948,784

(22) Filed: Oct. 1, 2020

(65) Prior Publication Data
US 2022/0014694 A1 Jan. 13, 2022

Related U.S. Application Data

(60) Provisional application No. 62/705,663, filed on Jul. 9, 2020.

(51) Int. Cl.
*H04N 5/355* (2011.01)
*H04N 5/3745* (2011.01)
(Continued)

(52) U.S. Cl.
CPC ..... *H04N 5/3559* (2013.01); *H01L 27/14609* (2013.01); *H01L 27/14643* (2013.01); *H04N 5/378* (2013.01); *H04N 5/37452* (2013.01)

(58) Field of Classification Search
CPC .. H04N 5/3559; H04N 5/37452; H04N 5/378; H04N 5/3745; H01L 27/14609; H01L 27/14643; H01L 27/14641
See application file for complete search history.

(56) References Cited

U.S. PATENT DOCUMENTS 8,487,232 B2* 7/2013 Iwamoto ............ H04N 5/37457
348/308
10,536,652 B2* 1/2020 Oh ..................... H01L 27/14609
(Continued)

OTHER PUBLICATIONS

Yun et al. "A Small-size Dual Pixel CMOS Image Sensor with Vertically Broad Photodiode of 0.61 um pitch." International Image Sensor Society, 2019.

*Primary Examiner* — Nhan T Tran
(74) *Attorney, Agent, or Firm* — Treyz Law Group, P.C.; Jason Tsai (57) ABSTRACT

An image sensor may include a shared pixel circuit having multiple photodiodes coupled to a common floating diffusion node via respective charge transfer gates. First, the pixel circuit may be reset, and a sample-and-hold reset (SHR) value may be read out. Charge from a first of the photodiodes may be transferred to the floating diffusion node, and a first sample-and-hold signal (SHS) value may be read out. A first correlated double sampling (CDS) value is obtained by computing the difference between the SHR value and the first SHS value. Without resetting again, charge from a second of the photodiodes may be transferred to the floating diffusion node, and a second SHS value may be read out. A second CDS value is obtained by computing the difference between the first and second SHS values. Reading out the shared pixel circuit in this way substantially reduces power consumption.

21 Claims, 12 Drawing Sheets

(51) Int. Cl.
    *H01L 27/146*     (2006.01)
    *H04N 5/378*     (2011.01)

(56) References Cited

U.S. PATENT DOCUMENTS

| | | |
|---|---|---|
| 10,777,601 B1 * | 9/2020 | Xu .................... H01L 27/14641 |
| 10,872,913 B2 * | 12/2020 | Fritz ................ H04N 5/35563 |
| 2002/0093034 A1 | 7/2002 | Hynecek |
| 2005/0051775 A1 | 3/2005 | Meynants |
| 2006/0261251 A1 | 11/2006 | Fossum |
| 2008/0094483 A1 | 4/2008 | Fossum |
| 2009/0091648 A1 | 4/2009 | Lion |
| 2013/0256510 A1 * | 10/2013 | Lyu .................... H04N 5/37457 |
| | | 250/206 |
| 2013/0314572 A1 * | 11/2013 | Guillon ................ H04N 5/3743 |
| | | 348/295 |
| 2015/0054973 A1 * | 2/2015 | Velichko ............ H04N 5/37452 |
| | | 348/218.1 |
| 2016/0165160 A1 | 7/2016 | Hseih |
| 2017/0048470 A1 | 2/2017 | Fernandez-Berni |
| 2019/0296059 A1 * | 9/2019 | Fritz ................ H04N 5/35563 |

\* cited by examiner

LOW POWER SHARED IMAGE PIXEL ARCHITECTURE

CROSS-REFERENCE TO RELATED APPLICATIONS

This application claims the benefit of U.S. Provisional Patent Application No. 62/705,663, filed on Jul. 9, 2020, the entire contents of which is incorporated herein by reference.

BACKGROUND

This relates generally to imaging devices, and more particularly, to image sensors with shared pixel architectures.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Row control circuitry is coupled to each pixel row for resetting, initiating charge transfer, or selectively activating a particular row of pixels for readout. Column circuitry is coupled to each pixel column for reading out pixel signals from the image pixels.

Conventional readout of a pixel requires at least two separate conversions: a first conversion to obtain the reset value and a second conversion to obtain the signal value in the photodiode. The signal value is then subtracted from the reset value to remove kTC noise (i.e., the thermal noise associated with switching the pixel transistors). In shared pixel architectures where multiple photodiodes are coupled to a shared floating-diffusion region, two conversions would be required for each of the photodiodes. Each individual conversion consumes power, so performing two conversions per photodiode would quickly multiply the dynamic power consumed by the image sensor. Removal of the reset conversion would reduce power, but the read noise would increase by an intolerable amount.

It is within this context that the embodiments described herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
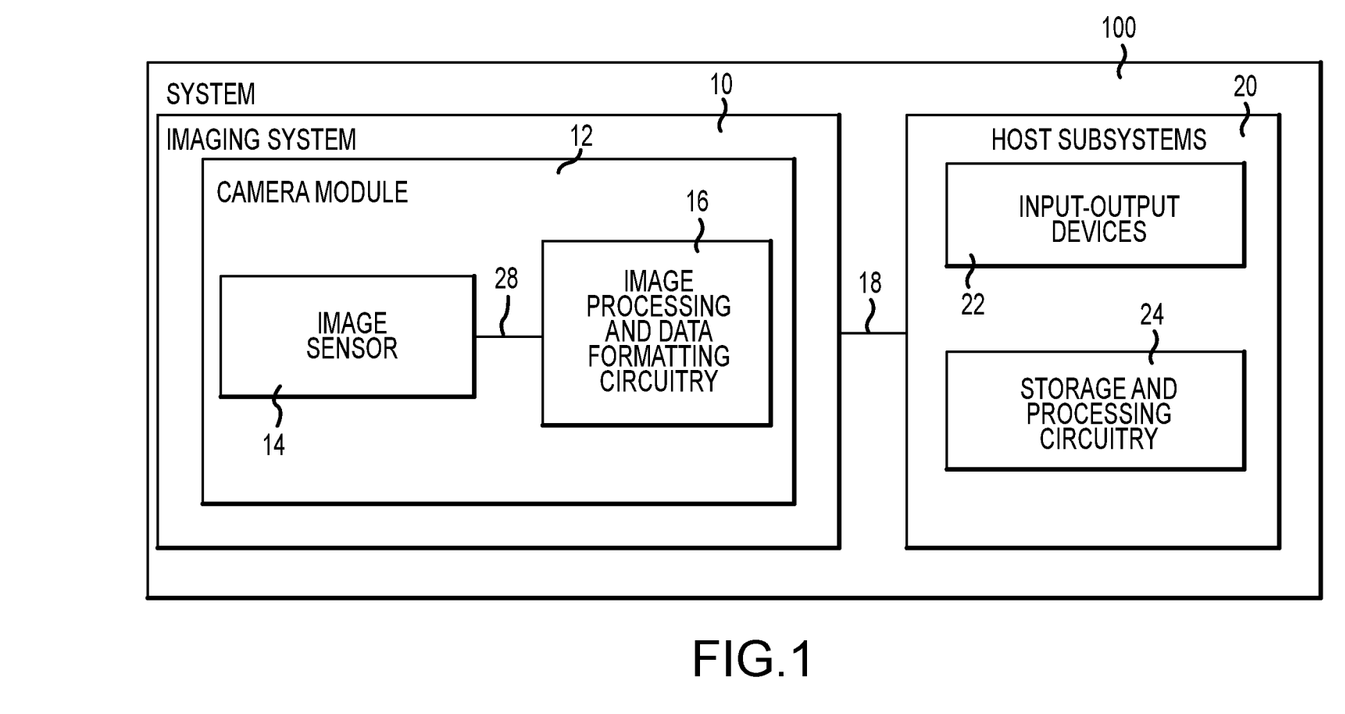
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data. Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
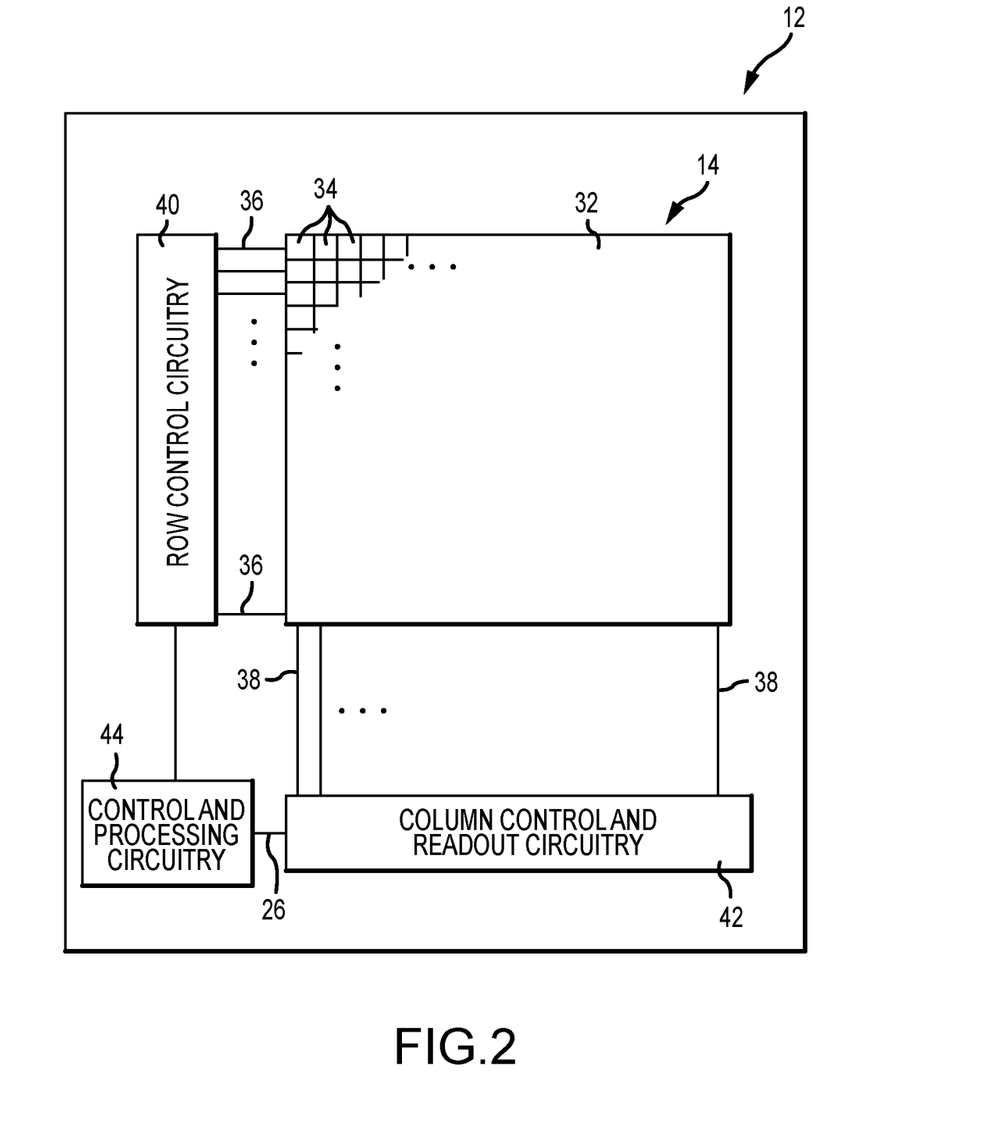
FIG. 2 is a diagram of an illustrative pixel array and associated row and column control circuitry for reading out image signals from an image sensor in accordance with an embodiment.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may sometimes be considered part of image processing and data formatting circuitry 16 in FIG. 1. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over control paths 36 (e.g., pixel reset control signals, charge transfer control signals, blooming control signals, row select control signals, dual conversion gain control signals, or any other desired pixel control signals).

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Figure 3:
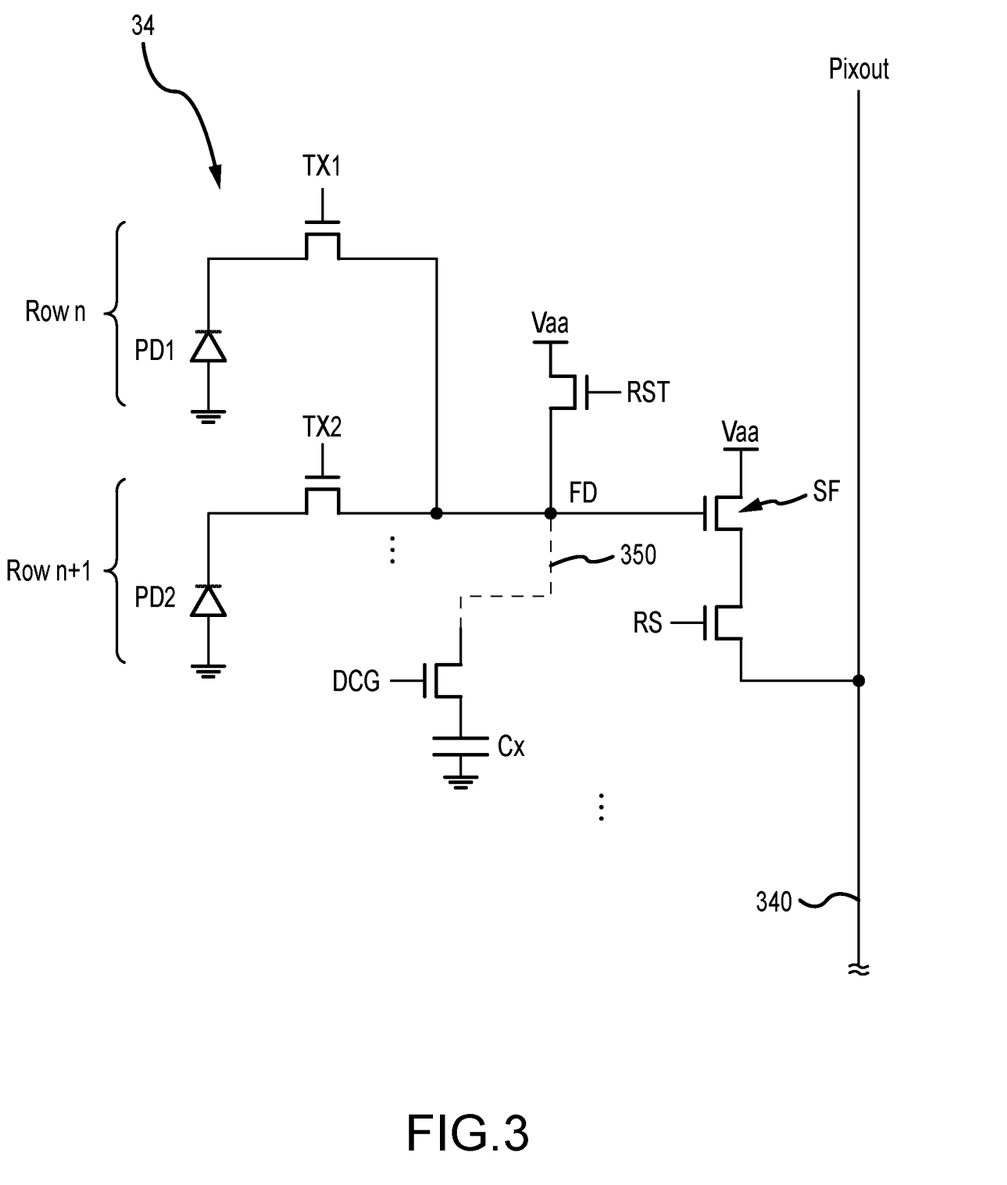
FIG. 3 is a circuit diagram of an illustrative pixel having multiple photodiodes with a shared readout circuit in accordance with an embodiment.

FIG. 3 is a circuit diagram of an illustrative pixel having multiple photodiodes with a shared readout circuit in accordance with an embodiment. As shown in FIG. 3, pixel 34 may include a first photodiode PD1 coupled to a corresponding floating diffusion node FD via a first charge transfer transistor controlled by charge transfer control signal TX1 and a second photodiode PD2 coupled to floating diffusion node FD via a second charge transfer transistor controlled by charge transfer control signal TX2. The first and second charge transfer transistors are sometimes referred to as charge transfer gates. Photodiode PD1 may be considered to be part of one row (e.g., row "n"), whereas photodiode PD2 may be considered to be part of another row (e.g., row "n+1"). This is merely illustrative. If desired, photodiodes such as PD1 and PD2 coupled to the same/shared floating diffusion region may alternatively be considered to be part of the same row and/or column.

The floating diffusion node FD is optionally coupled to a capacitor such as capacitor Cx via a dual conversion gain (DCG) transistor that is controlled by a DCG signal (see optional connection path 350). Capacitor Cx may be a fixed capacitor or an variable capacitor (e.g., an adjustable capacitor bank). Capacitor Cx can be switched into use by turning on the DCG switch, which configures pixel 34 in a low gain mode. Capacitor Cx can also be switched out of use by turning off the DCG switch, which configures pixel 34 in a high gain mode.

The floating diffusion node FD may also be coupled to a positive power supply terminal on which positive power supply voltage Vaa is provided via a reset transistor. The reset transistor may be turned on by asserting reset control signal RST to reset the floating diffusion region to a reset level. The FD node may further be coupled to a gate terminal of a source follower transistor SF. The source follower transistor (sometimes referred to as a source follower gate) may be coupled in series with a row select transistor between the positive power supply terminal and a column output line 340 (e.g., equivalent to line 38 of FIG. 2). The row select transistor may be turned on by asserting row select control signal RS to drive a pixel output voltage Pixout onto column line 340. In the example of FIG. 3, only one pixel 34 is shown to be connected to pixel column line 340. This is merely illustrative. In general, tens, hundreds, or even thousands of pixels 34 may be connected to each pixel column line 340.

In FIG. 3, all the transistors within pixel 34 other than the two charge transfer transistors and photodiodes PD1/PD2 may be referred to collectively as the shared readout circuit for pixel 34. Since multiple photodiodes are coupled to the same floating diffusion node and thus share the same readout circuit, image pixel 34 is sometimes referred to as having a shared pixel architecture and is sometimes referred to as being a shared pixel circuit. The example of FIG. 3 in which two photodiodes PD1 and PD2 share the same readout circuit (sometimes referred to as being a "2×1" shared pixel circuit) is merely illustrative and is not intended to limit the scope of the present embodiments.

Figure 4A:
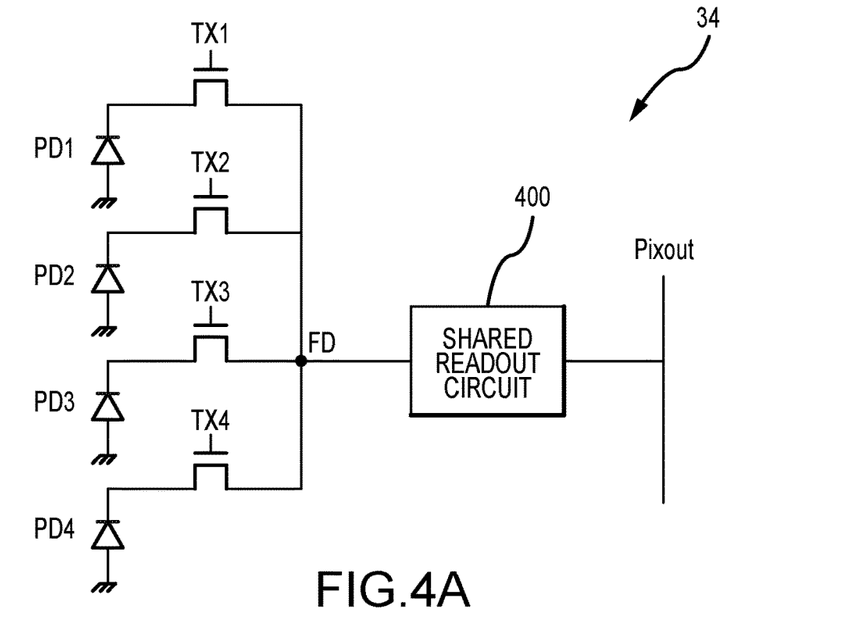
FIG. 4A is a diagram illustrating a 4×1 shared pixel circuit in accordance with an embodiment.

FIG. 4A is a diagram illustrating a "4×1" shared pixel circuit in accordance with another embodiment. As shown in FIG. 4A, pixel 34 may include a first photodiode PD1 coupled to a corresponding floating diffusion node FD via a first charge transfer gate controlled by TX1, a second photodiode PD2 coupled to the FD node via a second charge transfer gate controlled by TX2, a third photodiode PD3 coupled to the FD node via a third charge transfer gate controlled by TX3, and a fourth photodiode PD4 coupled to the FD node via a fourth charge transfer gate controlled by TX4. The common FD node may be coupled to a pixel output column line via a shared readout circuit 400. Shared readout circuit 400 may include a reset transistor, a source follower transistor, a row select transistor, a DCG transistor, and/or other suitable readout transistors). The shared readout circuit 400 in each pixel 34 and column readout circuitry 42 of FIG. 2 may sometimes be referred to collectively as readout circuitry. In one suitable arrangement, the four photodiodes PD1-PD4 in pixel 34 of FIG. 4A may be considered to be part of four different rows. In another suitable arrangement, the four photodiodes PD1-PD4 in pixel 34 of FIG. 4A may be considered to be part of four different columns. In yet another suitable arrangement, the four photodiodes PD1-PD4 in pixel 34 of FIG. 4A may be considered to be part of the same row and/or the same column.

Figure 4B:
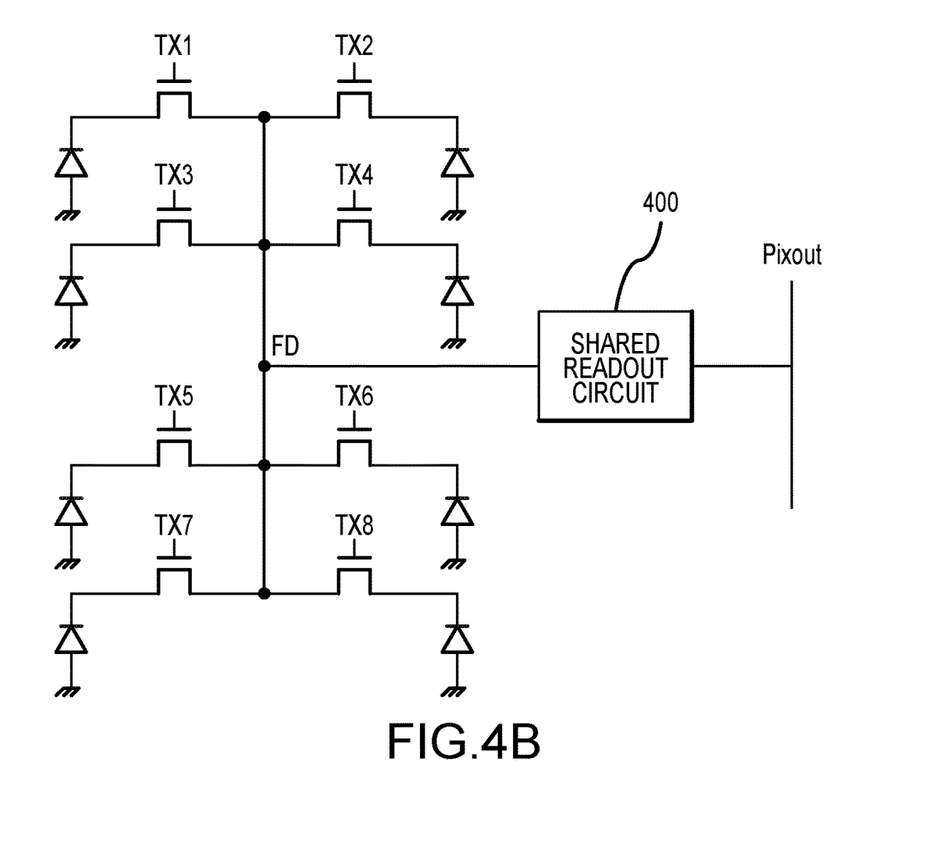
FIG. 4B is a diagram illustrating a 4×2 shared pixel circuit in accordance with an embodiment.

FIG. 4B is a diagram illustrating a "4×2" shared pixel circuit in accordance with yet another embodiment. As shown in FIG. 4B, pixel 34 may include eight different photodiodes coupled to a common floating diffusion node FD via corresponding charge transfer gates controlled by TX1-TX8, respectively. The common FD node may be coupled to a pixel output column line via a shared readout circuit 400. In one suitable arrangement, the eight photodiodes in pixel 34 of FIG. 4B may be considered to be part of four different rows and two different columns. In another suitable arrangement, the eight photodiodes in pixel 34 of FIG. 4B may be considered to be part of four different columns and two different rows. In yet another suitable arrangement, the eight photodiodes in pixel 34 of FIG. 4B may be considered to be part of the same row and/or the same column.

The examples of FIGS. 3, 4A, and 4B are merely illustrative. In general, pixel 34 may be a shared pixel circuit with any suitable number of photodiodes coupled to a shared floating diffusion node FD and readout circuit 400.

Conventionally, a shared pixel circuit with m photodiodes would require a reset conversion followed by a signal conversion for each of the m shared photodiodes. In other words, 2*m conversion would be required. Thus, in the example of FIG. 4B, 2*8 or a total of 16 conversions is needed to read out all the charge from the eight shared photodiodes. Performing pixel readout in this way may consume too much power.

Figure 5:
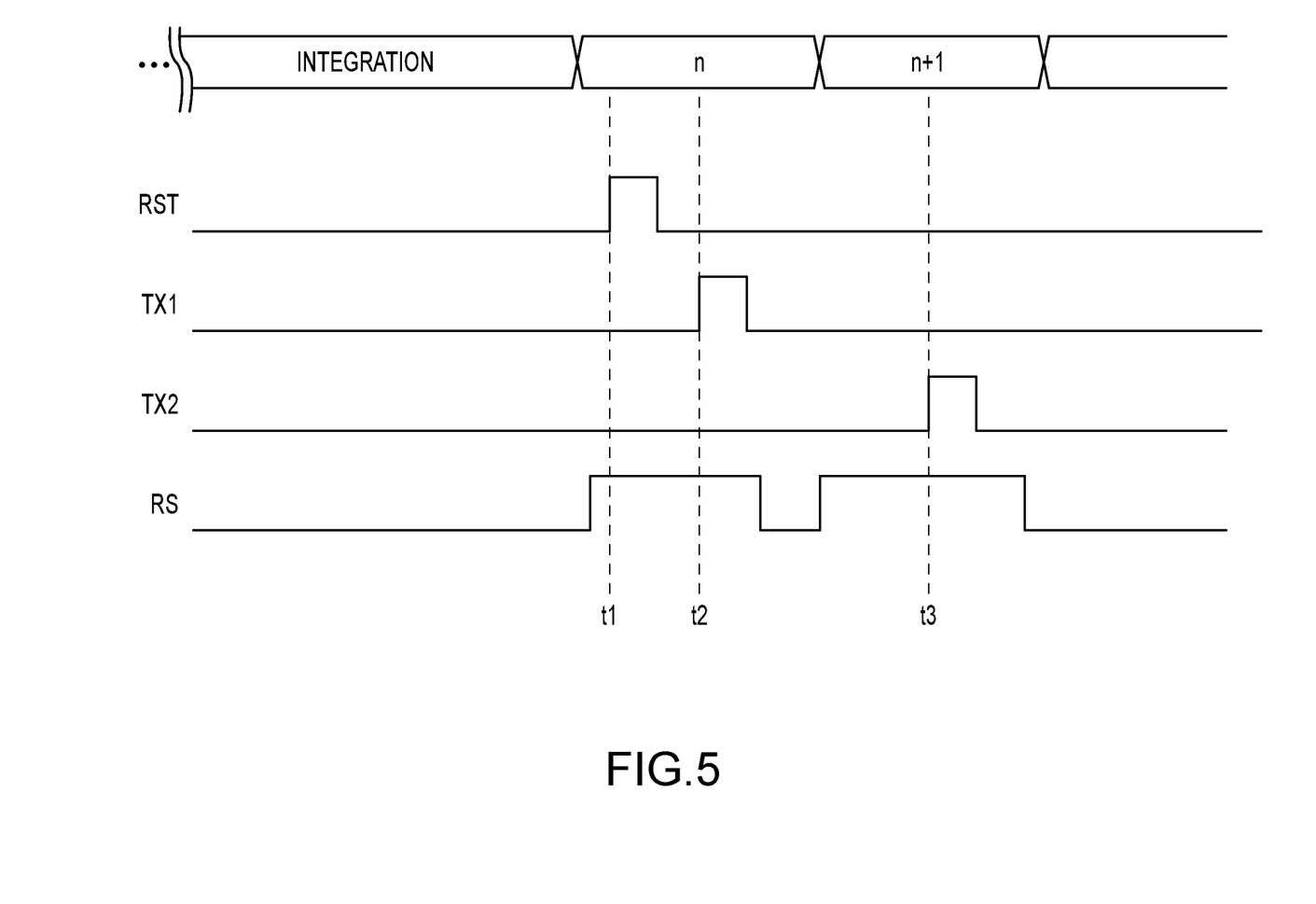
FIG. 5 is a timing diagram illustrating only (m+1) conversions for m shared photodiodes in accordance with an embodiment.

In accordance with an embodiment, shared pixel circuits may be operated using a readout process that uses one photodiode's signal value as another photodiode's reset value. FIG. 5 is a timing diagram illustrating how only three conversions is needed when operating the 2×1 shared pixel circuit 34 of FIG. 3. A shown in FIG. 5, all of the photodiodes may be allowed to integrate charge prior to time t1. At time t1, the row select signal RS may be asserted, and the reset control signal RST may be pulsed high to reset the floating diffusion node FD. After reset, the shared readout circuit may be used to obtain a sample-and-hold reset (SHR) value.

At time t2, the first charge transfer control signal TX1 may be pulsed high to transfer charge from PD1 to the FD node. After the PD1 charge has been transferred to the common FD node, the shared readout circuit may be used to obtain a first sample-and-hold signal (SHS1) value. The row select signal may be driven low when transitioning from one row to another row (e.g., from row n to row n+1).

At time t3, the second charge transfer control signal TX2 may be pulsed high to transfer charge from PD2 to the FD node. After the PD2 charge has been transferred to the common FD node, the shared readout circuit may be used to obtain a second sample-and-hold signal (SHS2) value. Note that no reset operation is performed between the acquisition of SHS1 and SHS2 (i.e., no reset is performed between time t2 when TX1 is pulsed high and time t3 when TX2 is pulsed high).

Figure 6A:
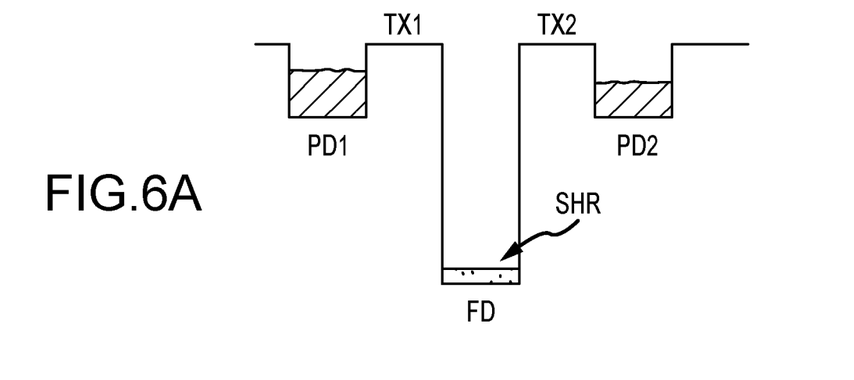
FIG. 6A is a potential diagram illustrating the amount of charge within various storage regions in a shared pixel circuit after a reset sampling operation in accordance with an embodiment.

FIG. 6A is a potential diagram illustrating the amount of charge within PD1, PD2, and the FD node after the reset operation. As shown in FIG. 6A, the residual charge in the floating diffusion region after reset may corresponding to the SHR value.

Figure 6B:
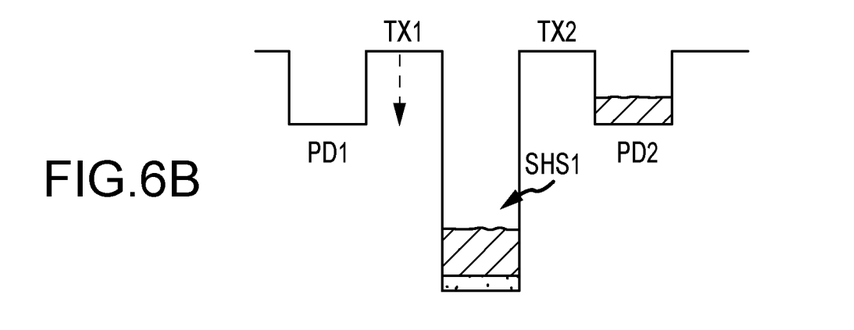
FIG. 6B is a potential diagram illustrating the amount of charge within various storage regions in a shared pixel circuit after a first signal sampling operation in accordance with an embodiment.

FIG. 6B is a potential diagram illustrating the amount of charge within PD1, PD2, and the FD node after the first charge transfer operation. As shown in FIG. 6B, the first charge transfer barrier may be lowered to allow all the charge from PD1 to flow to the FD region. The total amount of charge in the FD region after the first charge transfer may then correspond to the SHS1 value.

Figure 6C:
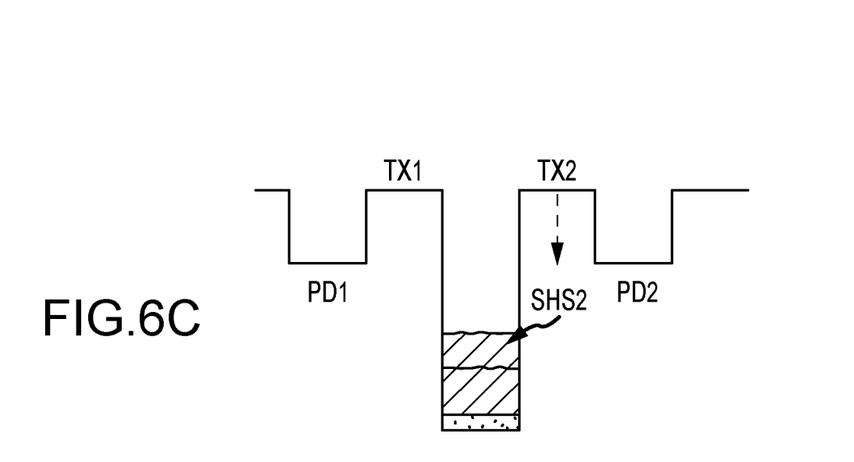
FIG. 6C is a potential diagram illustrating the amount of charge within various storage regions in a shared pixel circuit after a second signal sampling operation in accordance with an embodiment.

FIG. 6C is a potential diagram illustrating the amount of charge within PD1, PD2, and the FD node after the second charge transfer operation. As shown in FIG. 6C, the second charge transfer barrier may be lowered to allow all the charge from PD2 to flow to the FD region. The total amount of charge in the FD region after the second charge transfer may then correspond to the SHS2 value. The FD node should have sufficient capacity to store all the charge from the associated photodiodes (e.g., the storage capacity of the FD node may be equal to or greater than the sum of the charge storage capacities of all the photodiodes in the shared pixel circuit). For instance, the FD region should have a storage capacity that is equal to m*Cpd, where m is the total number of shared photodiodes in pixel 34 and where Cpd is the capacity of each photodiode. The floating diffusion node, however, should not be so big that the input referred read noise can longer be reduced via correlated double sampling.

Figure 7:
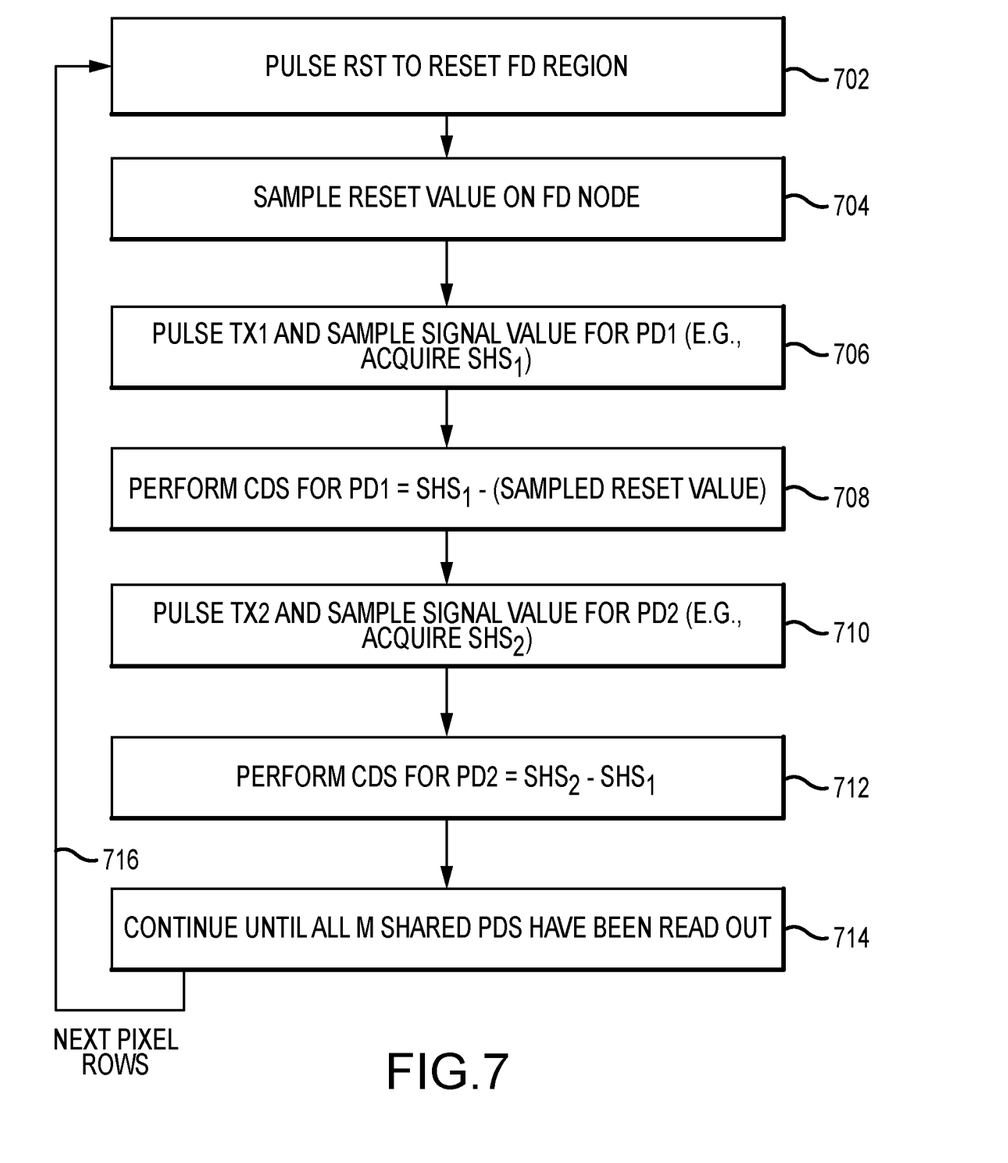
FIG. 7 is a flow chart of illustrative steps for operating a shared pixel circuit that uses a previous pixel signal value as the next pixel's reset value to save power in accordance with an embodiment.

FIG. 7 is a flow chart of illustrative steps for operating a shared pixel circuit 34 of the type shown in FIG. 3. At step 702 (corresponding to time t1 in FIG. 5), the reset control signal RST may be pulsed high to reset the floating diffusion region. At step 704, the reset value on the FD node may be sampled (e.g., to obtain a SHR value).

At step 706 (corresponding to time t2 in FIG. 5), the first charge transfer control signal TX1 may be pulsed high to transfer charge from the first photodiode PD1 to the FD node. Upon completion of charge transfer, a first signal value for PD1 may be sampled (e.g., to obtain an SHS1 value). At step 708, a first correlated double sampling (CDS) operation may be performed for photodiode PD1 by computing the difference between SHS1 and SHR.

At step 710 (corresponding to time t3 in FIG. 5), the second charge transfer control signal TX2 may be pulsed high to transfer charge from the second photodiode PD2 to the FD node. Upon completion of charge transfer, a second signal value for PD2 may be sampled (e.g., to obtain an SHS2 value). At step 712, a second correlated double sampling (CDS) operation may be performed for photodiode PD2 by computing the difference between SHS2 and SHS1.

As illustrated here, SHS1 is used as the effective reset value for the next signal SHS2. By using the previous SHS as the current SHR, a reset operation for each additional shared photodiode may be obviated. This modified CDS scheme where successive SHS signals are acquired without obtaining additional SHR values may continue until all of the m shared photodiodes have been read out (step 714). Processing may loop back to step 702 to process subsequent pixel rows, as indicated by path 716.

In the illustrative pixel 34 of FIG. 3, m is equal to 2, but m may in general be equal to 3, 4, 5, 6, 7, 8, 9, 10, 12, 14, 16, 18, 10-20, 20-100, or other suitable integer value. Configured and operated in this way, only (m+1) total conversions are needed (e.g., only one SHR conversion followed by m SHS conversions). Thus, compared to conventional readout schemes that require 2*m conversions, the readout scheme described in connection with FIGS. 5-7 reduces the total number of conversions by (m-1), thus dramatically reducing power consumption for shared pixel circuits. In other words, the dynamic power savings might approach 50% as m increases. Such pixel structures may therefore be suitable for any low power image sensor applications.

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way. For example, the CDS operations of steps 708 and 712 may be performed much later in the digital domain after signals from the entire array of pixels have been read out.

Figure 8:
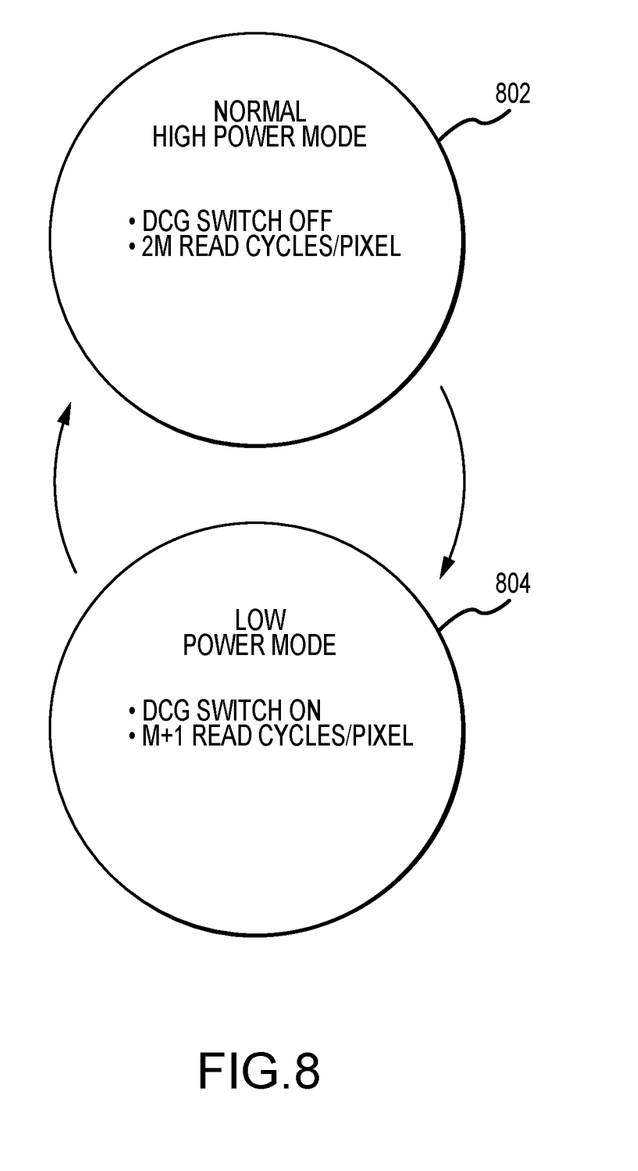
FIG. 8 is a diagram showing how an illustrative shared pixel circuit may be operable in a high power mode and a low power mode in accordance with an embodiment.

FIG. 8 is a diagram showing how a shared pixel circuit such as pixel 34 may be operable in a high power mode 802 and a low power mode 804. When configured in the high power mode 802, the DCG switch (see FIG. 3) may be turned off to decouple the extra capacitance Cx from the floating diffusion node. During this time, the total capacity at the FD node is reduced (which also effectively increases the gain of pixel 34). With this reduced capacity, pixel 34 may not be able to storage charge transferred from more than one of the shared photodiodes, so pixel 34 will have to perform 2*m read conversions per pixel.

When configured in the low power mode 804, the DCG switch may be turned on to connect the extra capacitance Cx to the floating diffusion node. During this time, the total capacity at the FD node is increased (which also effectively decreases the gain of pixel 34). With this elevated capacity, pixel 34 may now be able to storage charge transferred from the multiple shared photodiodes, so pixel 34 can now only perform m+1 read conversions (as opposed to 2*m conversions) per pixel to save power. In other words, capacitor Cx may provide additional storage capacity for the floating diffusion node so that the floating diffusion node has a total storage capacity that is equal to or greater than the sum of the storage capacities of PD1 and PD2.

Figure 9A:
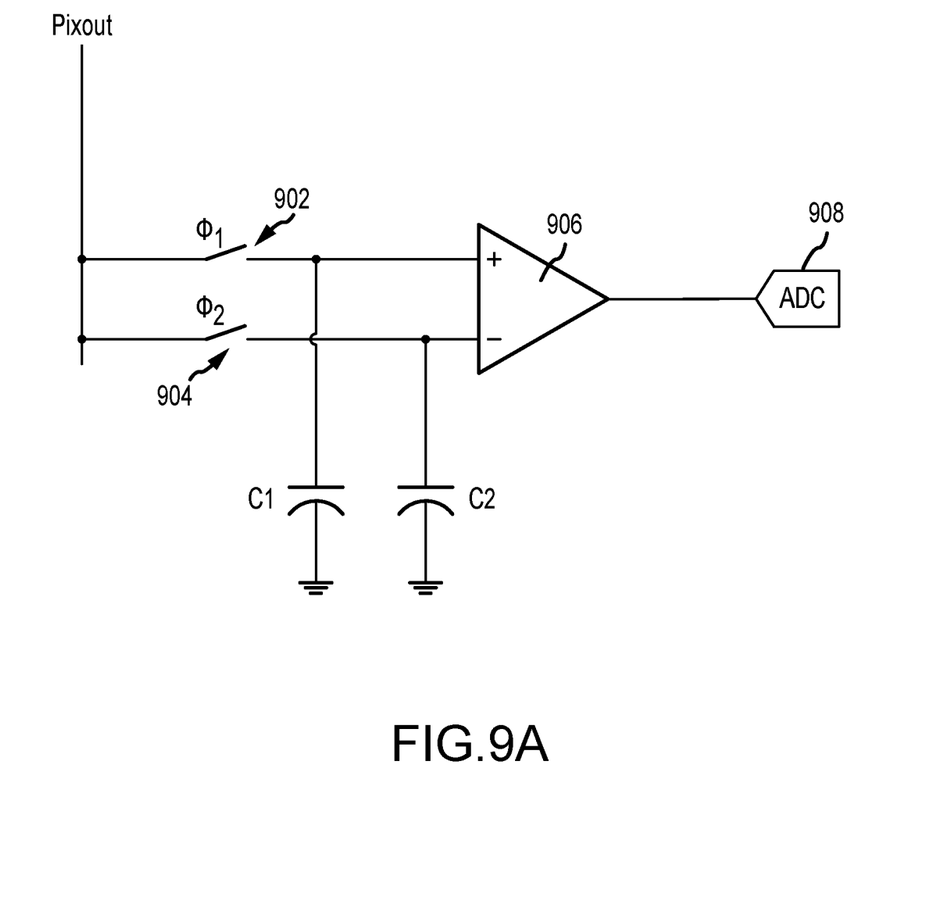
FIG. 9A is a diagram of illustrative analog comparator circuitry that may be used to compute correlated double sampling (CDS) output values in accordance with an embodiment.

FIG. 9A is a diagram illustrating one suitable arrangement in which the CDS operation is implemented in the analog domain using a comparator circuit such as analog comparator 906. As shown in FIG. 9A, the pixel column output line may be coupled to a first (positive) input terminal of analog comparator 906 via a first switch 902 controlled by signal Φ1 and to a second (negative) input terminal of analog comparator 906 via a second switch 904 controlled by signal Φ2. A first capacitor C1 may be coupled between the first (+) input of comparator 906 and ground (e.g., a ground power supply line on which a ground signal is provided), whereas a second capacitor C2 may be coupled between the second (−) input of comparator 906 and the ground line. Comparator 906 has an output that is coupled to an analog-to-digital converter (ADC) circuit 908. The circuitry of FIG. 9A may also be considered to be part of the readout circuitry.

Figure 9B:
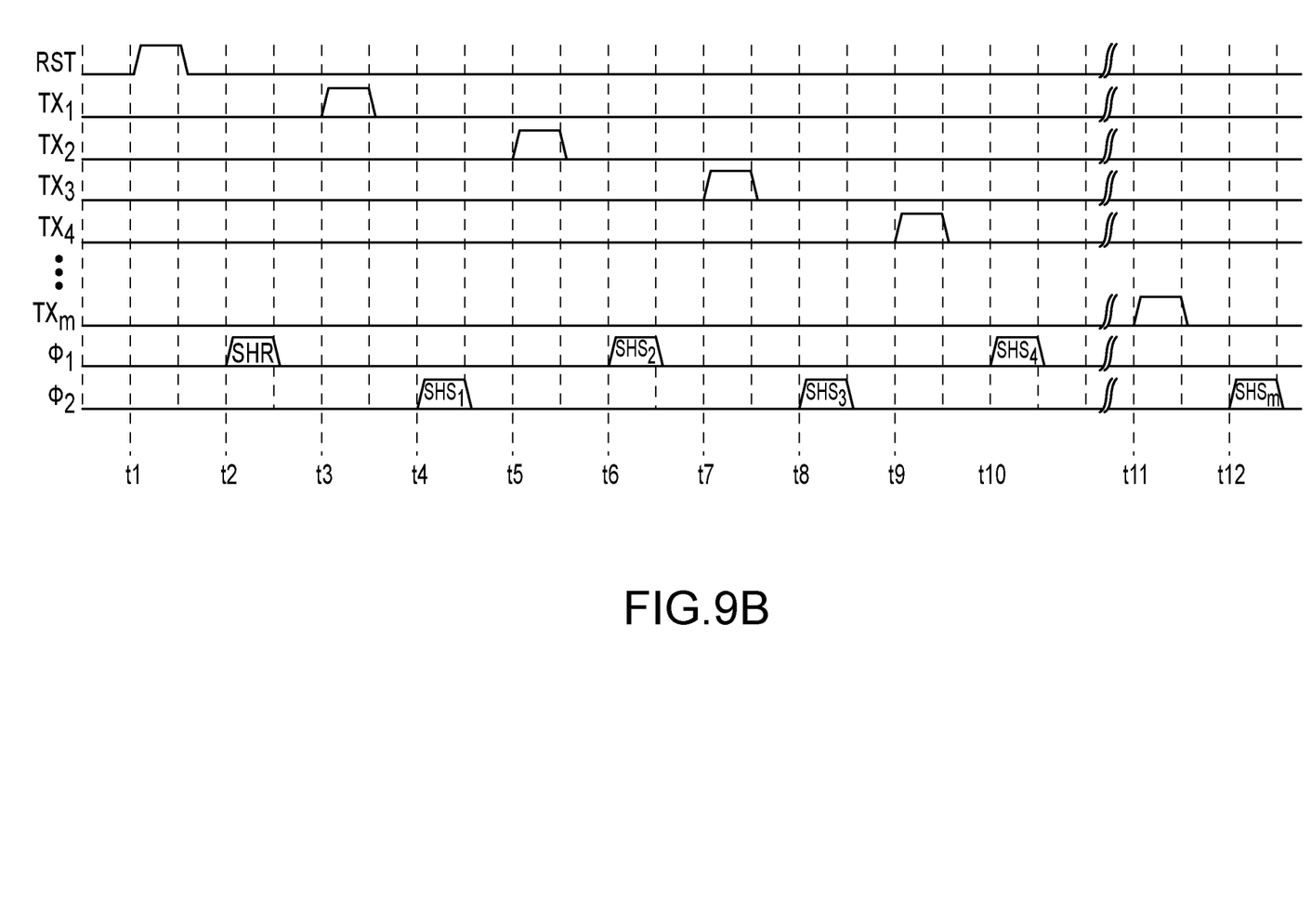
FIG. 9B is a timing diagram showing illustrative waveforms involved in using the analog comparator circuitry of FIG. 9A in accordance with an embodiment.

FIG. 9B is a timing diagram showing illustrative waveforms involved in using the analog comparator circuitry of FIG. 9A. The example of FIG. 9A-9B assumes that there are m photodiodes with m charge transfer gates sharing a common FD node.

At time t1, the reset transistor is activated to reset the FD node. At time t2, the Φ1 signal may be pulsed high to sample a SHR value onto capacitor C1.

At time t3, the first charge transfer control signal TX1 is pulsed high to allow charge to flow from the first photodiode to the FD node. At time t4, the Φ2 signal may be pulsed high to sample a SHS1 value onto capacitor C2. At this time, analog comparator 906 may output a corresponding analog signal that is proportional to the difference between SHS1 and SHR to produce a CDS value for the first photodiode. Comparator 906 operated in this way may sometimes be referred to as an analog subtractor circuit, a difference amplifier, a differential amplifier, etc. This analog CDS value may then be converted to its digital equivalent using ADC circuit 908.

At time t5, the second charge transfer control signal TX2 is pulsed high to allow charge to flow from the second photodiode to the FD node. At time t6, the Φ1 signal may be pulsed high to sample a SHS2 value onto capacitor C1. At this time, comparator 906 may output a corresponding analog signal that is proportional to the difference between SHS2 and SHS1 to produce a CDS value for the second photodiode. This analog CDS value may then be converted to its digital equivalent using ADC circuit 908.

At time t7, the third charge transfer control signal TX3 is pulsed high to allow charge to flow from the third photodiode to the FD node. At time t8, the Φ2 signal may be pulsed high to sample a SHS3 value onto capacitor C2. At this time, comparator 906 may output a corresponding analog signal that is proportional to the difference between SHS3 and SHS2 to produce a CDS value for the third photodiode. This analog CDS value may then be converted to its digital equivalent using ADC circuit 908.

At time t9, the fourth charge transfer control signal TX4 is pulsed high to allow charge to flow from the fourth photodiode to the FD node. At time t10, the Φ1 signal may be pulsed high to sample a SHS4 value onto capacitor C1. At this time, comparator 906 may output a corresponding analog signal that is proportional to the difference between SHS4 and SHS3 to produce a CDS value for the fourth photodiode. This analog CDS value may then be converted to its digital equivalent using ADC circuit 908. The sampling of SHS values may alternate between capacitors C1 and C2 at the input of comparator 906 in this way until the last SHSm signal has been read out and converted (e.g., by using analog comparator 906 to output ($SHS_m$-$SHS_{m-1}$).

Figure 10A:
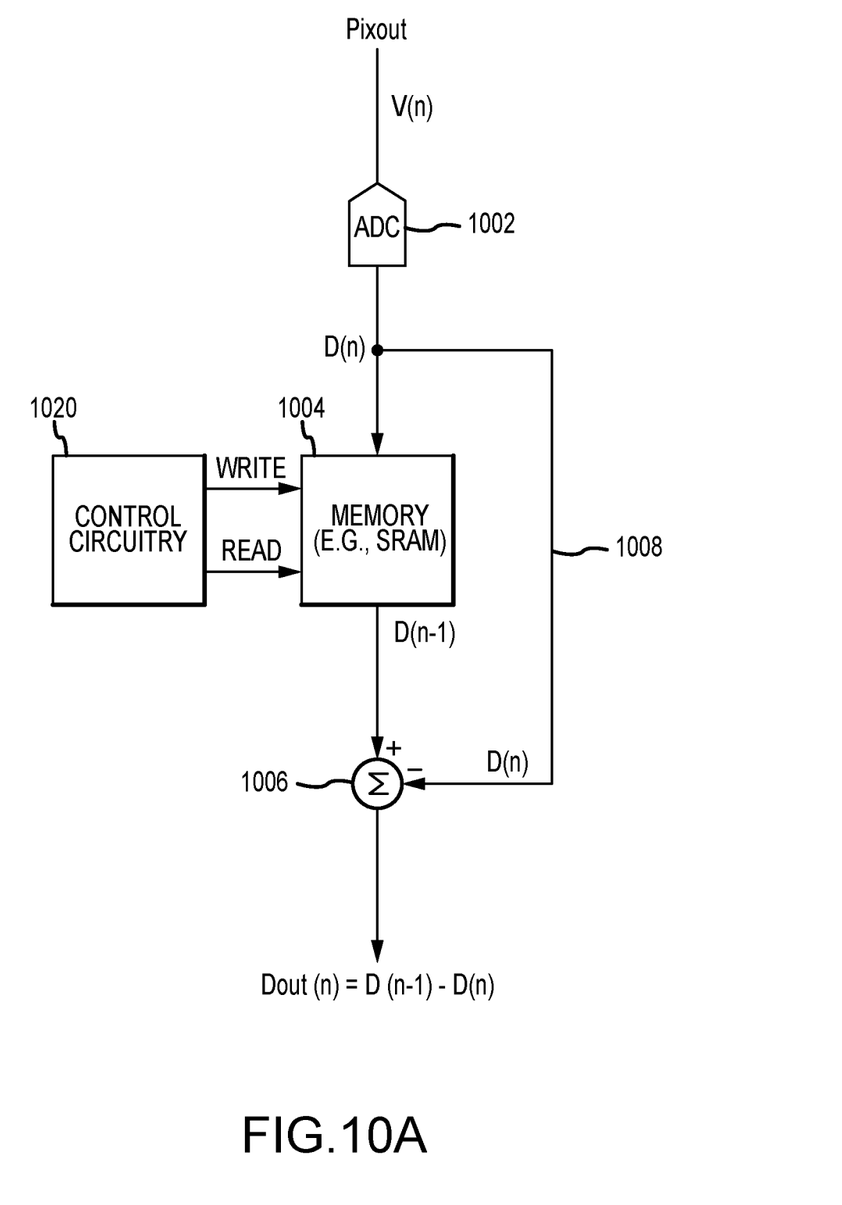
FIG. 10A is a diagram of illustrative digital processing circuitry that may be used to compute correlated double sampling (CDS) output values in accordance with an embodiment.

FIG. 10A is a diagram illustrating another suitable arrangement in which the CDS operation is implemented in the digital domain. As shown in FIG. 10A, the pixel column output line may be coupled to an analog-to-digital convert (ADC) circuit 1002 configured to convert the pixel analog output voltage V(n) to its digital equivalent D(n). The converted digital signal D(n) may be selectively written into memory circuit 1004, which may be implemented as a static random-access memory (SRAM) circuit, as an example. The accessing of SRAM circuit 1004 may be controlled using control circuitry 1020. A digital subtraction circuit 1006 may be configured to compute the difference between a previous signal read out from the memory circuit 1004 (e.g., signal D(n−1)) and a current converted signal D(n). Thus, digital subtraction circuit 1006 may generate an output Dout(n) that is equal to D(n−1) minus D(n). Alternatively, digital subtraction circuit 1006 may generate an output Dout(n) that is equal to D(n) minus D(n−1). The circuitry of FIG. 10A may also be considered to be part of the readout circuitry.

Figure 10B:
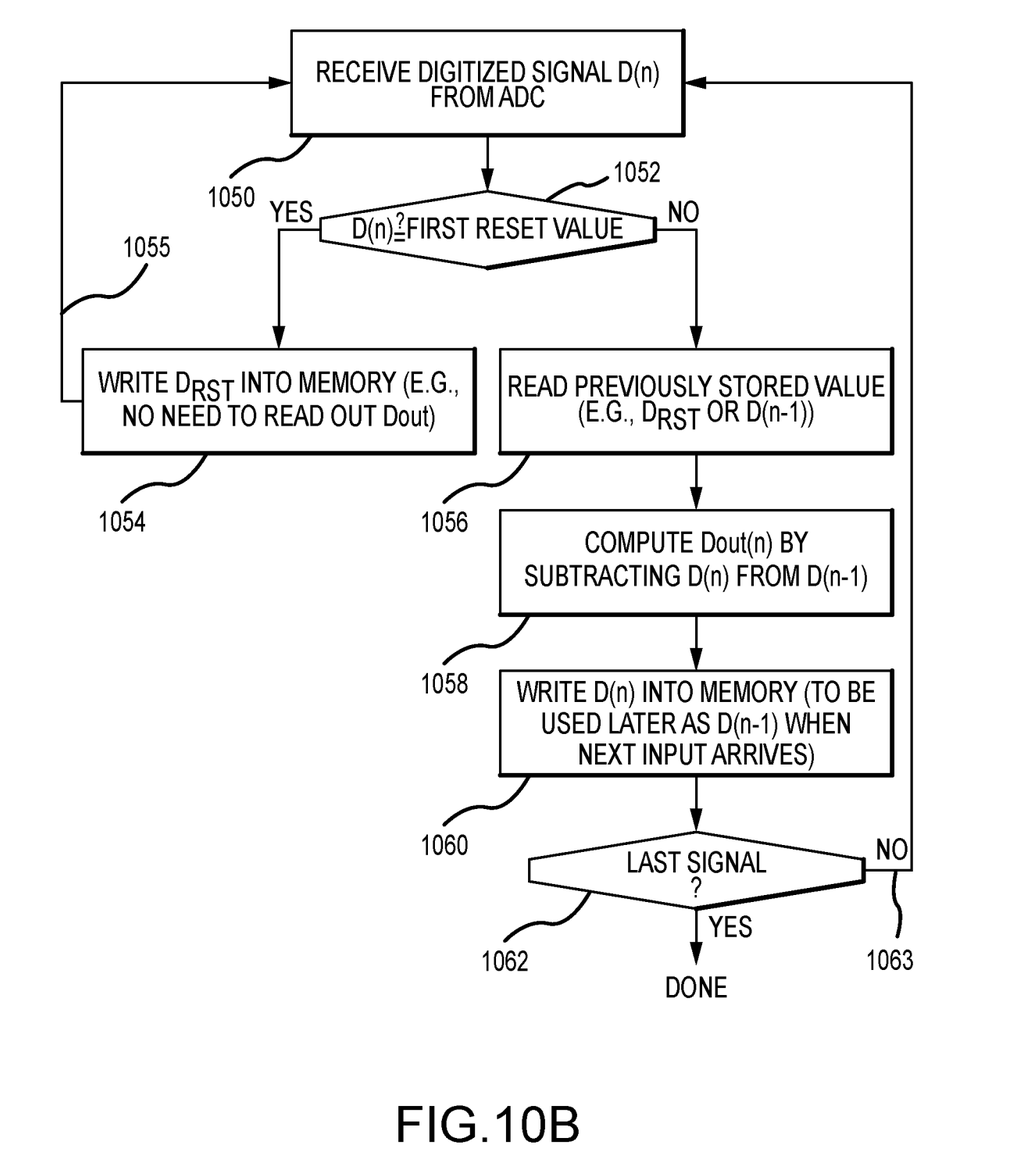
FIG. 10B is a flow chart of illustrative steps involved in using the digital processing circuitry of FIG. 10A in accordance with an embodiment.

FIG. 10B is a flow chart of illustrative steps involved in using the digital processing circuitry of FIG. 10A. At step 1050, the ADC circuit 1002 may output a digitized signal D(n). At step 1052, controller 1020 may determine whether D(n) corresponds to the first reset value (SHR). In response to determining that D(n) is the first SHR value, then that value Drst is written into memory (at step 1054). Since this is the first and only reset value acquisition, no signal value has been sampled yet, so there is no need to read out Dout. Processing may then loop back to step 1050, as indicated by return path 1055.

Processing may instead proceed from step 1052 to step 1056 in response to determining that D(n) is not the first SHR value. At step 1056, controller 1020 may direct memory circuit 1004 to read out a previously stored value, which may either be Drst if the previous sampling was the first reset value or is otherwise equal to D(n−1).

At step 1058, digital subtraction circuit 1006 may receive signal D(n−1) read out from memory circuit 1004 and signal D(n) directly from the output of ADC circuit 1002 via bypass path 1008 and may compute a corresponding difference output Dout(n) by subtracting D(n) from D(n−1) or vice versa. At step 1060, the current D(n) may then be written into memory circuit 1004, which may later be used as D(n−1) for the next CDS value computation.

At step 1062, controller 1020 may determine whether D(n) received at step 1050 is the last signal (i.e., if there are more photodiodes to be read out). If the current D(n) received at step 1050 is not the last signal, then processing may loop back to step 1050 to read out from the next shared photodiode, as indicated by return path 1063. If the current D(n) received at step 1050 is the last signal (i.e., if all the photodiodes in the shared pixel have been read out and sampled), then the processing for that pixel is complete. The steps of FIG. 10B may be repeated for remaining pixels in the array.

These steps are merely illustrative and are not intended to limit the present embodiments. At least some of the existing steps may be modified or omitted; some of the steps may be performed in parallel; additional steps may be added or inserted; and the order of certain steps may be reversed or altered. In general, the embodiments described herein may be applied to either rolling shutter pixels or global shutter pixels with a shared pixel architecture.

The foregoing is merely illustrative of the principles of this invention and various modifications can be made by those skilled in the art without departing from the scope and spirit of the invention. The foregoing embodiments may be implemented individually or in any combination.

What is claimed is:

1. An image pixel, comprising:
   a floating diffusion node;
   a first photodiode;
   a first charge transfer transistor coupled between the first photodiode and the floating diffusion node;
   a second photodiode;
   a second charge transfer transistor coupled between the second photodiode and the floating diffusion node; and
   readout circuitry coupled to the floating diffusion node, wherein the readout circuitry is configured to receive a reset value, a first signal value from the first photodiode, and a second signal value from the second photodiode, wherein the reset value and the first signal value are used to compute a first difference value for the first photodiode, and wherein the first signal value and the second signal value are used to compute a second difference value for the second photodiode.

2. The image pixel of claim 1, wherein the first photodiode has a first charge storage capacity, wherein the second photodiode has a second charge storage capacity, and wherein the floating diffusion node has a third charge storage capacity that is equal to or greater than the sum of the first and second charge storage capacities.

3. The image pixel of claim 1, further comprising:
   a capacitor selectively coupled to the floating diffusion node, wherein the first photodiode has a first charge storage capacity, wherein the second photodiode has a second charge storage capacity, wherein the capacitor provides additional storage capacity for the floating diffusion node so that the floating diffusion node has a total storage capacity that is equal to or greater than the sum of the first and second storage capacities.

4. The image pixel of claim 3, wherein the image pixel is operable in a first mode during which the capacitor is decoupled from the floating diffusion node and is further operable is a second mode during which the capacitor is coupled to the floating diffusion node, and wherein the readout circuitry is configured to perform a first number of read conversions during the first mode and is further configured to perform a second number of read conversions that is less than the first number of read conversions during the second mode.

5. The image pixel of claim 1, wherein the first and second photodiodes are part of m total photodiodes in the image pixel, and wherein the readout circuitry is configured to perform at most (m+1) read conversions to compute output values for the m total photodiodes.

6. The image pixel of claim 5, wherein m is an integer selected from the group consisting of: 2, 4, 8, and 16.

7. The image pixel of claim 1, wherein the readout circuitry comprises:
a pixel output line;
an analog comparator circuit having a first input selectively coupled to the pixel output line and a second input selectively coupled to the pixel output line; and
an analog-to-digital converter configured to receive signals from the analog comparator circuit.

8. The image pixel of claim 7, wherein the readout circuitry further comprises:
a first switch coupled between the pixel output line and the first input of the analog comparator circuit; and
a second switch coupled between the pixel output line and the second input of the analog comparator circuit, wherein at most one of the first and second switches is turned on at any given point in time.

9. The image pixel of claim 8, wherein the readout circuitry further comprises:
a first capacitor that is connected to the first input of the analog comparator and that is configured to receive the first signal value; and
a second capacitor that is connected to the second input of the analog comparator and that is configured to receive the second signal value.

10. The image pixel of claim 1, wherein the readout circuitry comprises:
a pixel output line;
an analog-to-digital converter configured to receive signals from the pixel output line and to generate a digital output signal; and
a memory circuit configured to store the digital output signal from the analog-to-digital converter.

11. The image pixel of claim 10, wherein the readout circuitry further comprises:
a subtraction circuit having a first input configured to receive the digital output signal from the analog-to-digital converter, a second input configured to receive a previously stored digital output signal from the memory circuit, and an output on which the first and second difference values are generated.

12. A method of operating an image pixel having a plurality of photodiodes selectively coupled to a shared floating diffusion node, the method comprising:
resetting the image pixel and sampling a corresponding reset value;
transferring charge from a first photodiode in the plurality of photodiodes to the floating diffusion node and sampling a corresponding first signal value; and
without resetting the image pixel after transferring charge from the first photodiode to the floating diffusion node, transferring charge from a second photodiode in the plurality of photodiodes to the floating diffusion node and sampling a corresponding second signal value.

13. The method of claim 12, further comprising:
computing a first output value by computing a difference between the sampled reset value and the sampled first signal value; and
computing a second output value by computing a difference between the sampled first signal value and the sampled second signal value.

14. The method of claim 13, wherein the plurality of photodiodes comprises only m photodiodes, the method further comprising:
performing less than 2*m total read conversions to compute output values for all m photodiodes.

15. The method of claim 13, wherein the plurality of photodiodes comprises only m photodiodes, the method further comprising:
performing only (m+1) total read conversions to compute output values for all m photodiodes.

16. The method of claim 12, further comprising:
transferring charge from a third photodiode in the plurality of photodiodes to the floating diffusion node and sampling a corresponding third signal value;
storing the sampled second signal value on a first capacitor;
storing the sampled third signal value on a second capacitor; and
with a comparator having a first input connected to the first capacitor and a second input connected to the second capacitor, computing a difference between the sampled second signal value and the sampled third signal value.

17. The method of claim 12, further comprising:
transferring charge from a third photodiode in the plurality of photodiodes to the floating diffusion node and sampling a corresponding third signal value;
storing the sampled second signal value on a static random-access memory (SRAM) circuit;
storing the sampled third signal value on the SRAM circuit; and
with a digital subtraction circuit, computing a difference between the sampled second signal value and the sampled third signal value.

18. An image pixel operable in first and second modes, comprising:
a floating diffusion node;
a plurality of photodiodes coupled to the floating diffusion node;
a capacitor; and
a dual conversion gain switch coupled between the floating diffusion node and the capacitor, wherein the dual conversion gain switch is configured in a first state so that signals are read out of the image pixel using a first number of cycles during the first mode and is further configured in a second state so that signals are read out of the image pixel using a second number of cycles, different than the first number of cycles, during the second mode.

19. The image pixel of claim 18, wherein the dual conversion gain switch is turned off during the first mode and is turned on during the second mode.

20. The image pixel of claim 18, wherein the second number of cycles is less than the first number of cycles.

21. The image pixel of claim 18, wherein the first mode comprises a high power mode, and wherein the second mode comprises a low power mode.

* * * * *